(12) United States Patent
Jeanrenaud et al.

(10) Patent No.: US 12,072,674 B2
(45) Date of Patent: Aug. 27, 2024

(54) BLACK COMPONENT DECORATED WITH STONES AND MANUFACTURING METHOD THEREOF

(71) Applicant: Omega SA, Biel/Bienne (CH)

(72) Inventors: Frédéric Jeanrenaud, La Chaux-de-Fonds (CH); Gregory Kissling, La Neuveville (CH); Stéphane Lauper, Cortaillod (CH); Agnès Marlot Doerr, Neuchatel (CH); Csilla Miko, Essentines-sur-Yverdon (CH)

(73) Assignee: Omega SA, Biel/Bienne (CH)

( * ) Notice: Subject to any disclaimer, the term of this patent is extended or adjusted under 35 U.S.C. 154(b) by 640 days.

(21) Appl. No.: 17/210,670

(22) Filed: Mar. 24, 2021

(65) Prior Publication Data
US 2022/0050419 A1 Feb. 17, 2022

(30) Foreign Application Priority Data

Aug. 11, 2020 (EP) ..................................... 20190569

(51) Int. Cl.
*G04B 19/12* (2006.01)
*C23C 14/08* (2006.01)
(Continued)

(52) U.S. Cl.
CPC ............ *G04B 19/12* (2013.01); *C23C 14/081* (2013.01); *C23C 16/403* (2013.01); *C23C 16/50* (2013.01);
(Continued)

(58) Field of Classification Search
CPC .... G04B 19/12; G04B 19/042; C23C 14/081; C23C 16/403; C23C 16/50; G04D 3/0048; G04D 3/0069
See application file for complete search history.

(56) References Cited

U.S. PATENT DOCUMENTS

| 5,323,732 A | 6/1994 | Consolo |
| 2009/0229308 A1 | 9/2009 | Mehta |

(Continued)

FOREIGN PATENT DOCUMENTS

| CH | 1 522 606 A1 | 4/2005 |
| CH | 707 581 A1 | 8/2014 |

(Continued)

OTHER PUBLICATIONS

Japanese Office Action issued Apr. 12, 2022 in Japanese Patent Application No. 2021-063278 (with English translation), 6 pages.
(Continued)

*Primary Examiner* — Edwin A. Leon
*Assistant Examiner* — Kevin Andrew Johnston
(74) *Attorney, Agent, or Firm* — Oblon, McClelland, Maier & Neustadt, L.L.P.

(57) ABSTRACT

A component for the internal parts or the movement for a timepiece or a piece of jewellery including a substrate partially coated with a black layer and decorated with at least one stone, the black layer including carbon nanotubes or aluminium oxide, the substrate being at least devoid of the black layer on the portion facing the stone. It also relates to the method for manufacturing this component for the timepiece or the piece of jewellery.

12 Claims, 2 Drawing Sheets

(51) Int. Cl.
  *C23C 16/40* (2006.01)
  *C23C 16/50* (2006.01)
  *G04B 19/04* (2006.01)
  *G04D 3/00* (2006.01)

(52) U.S. Cl.
  CPC ......... *G04B 19/042* (2013.01); *G04D 3/0048* (2013.01); *G04D 3/0069* (2013.01); *G04D 3/0092* (2013.01)

(56) References Cited

U.S. PATENT DOCUMENTS

| | | | |
|---|---|---|---|
| 2015/0359303 A1* | 12/2015 | Lebreton | G04B 5/16 63/26 |
| 2018/0157214 A1* | 6/2018 | Perret | B32B 9/04 |
| 2019/0133270 A1* | 5/2019 | Bourban | C25D 7/005 |

FOREIGN PATENT DOCUMENTS

| | | | | |
|---|---|---|---|---|
| CH | 709 669 | A1 | 11/2015 | |
| CH | 711 141 | A2 | 11/2016 | |
| CH | 713156 | A2 * | 5/2018 | ........... G04B 19/106 |
| CN | 105307535 | A | 2/2016 | |
| DE | 10212967 | A1 * | 10/2003 | ............. G04B 19/18 |
| EP | 2 796 066 | A1 | 10/2014 | |
| EP | 3327517 | A1 * | 5/2018 | ............. G04B 19/30 |
| FR | 657 701 | A5 | 9/1986 | |
| JP | 54-17763 | U | 2/1979 | |
| JP | 5-38588 | U | 5/1993 | |
| JP | 6-51075 | A | 2/1994 | |
| JP | 7-92276 | A | 4/1995 | |
| JP | 2016-513247 | A | 5/2016 | |
| JP | 2019-84344 | A | 6/2019 | |
| WO | WO-2019039097 | A1 * | 2/2019 | ............. A44C 27/00 |

OTHER PUBLICATIONS

Combined Chinese Office Action and Search Report issued Sep. 9, 2023, in corresponding Chinese Patent Application No. 202110927675.0 (with English Translation and English Translation of Category of Cited Documents) 13 pages.

European Search Report issued Dec. 17, 2020 in European Application 20190569.2 filed Aug. 11, 2020 (with English Translation of Categories of Cited Documents), 3 pages.

* cited by examiner

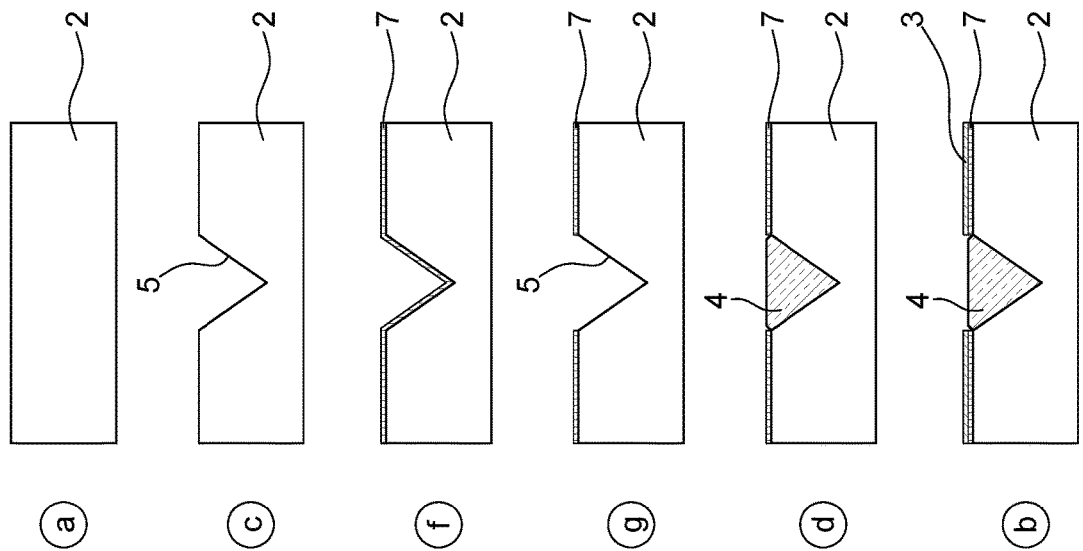
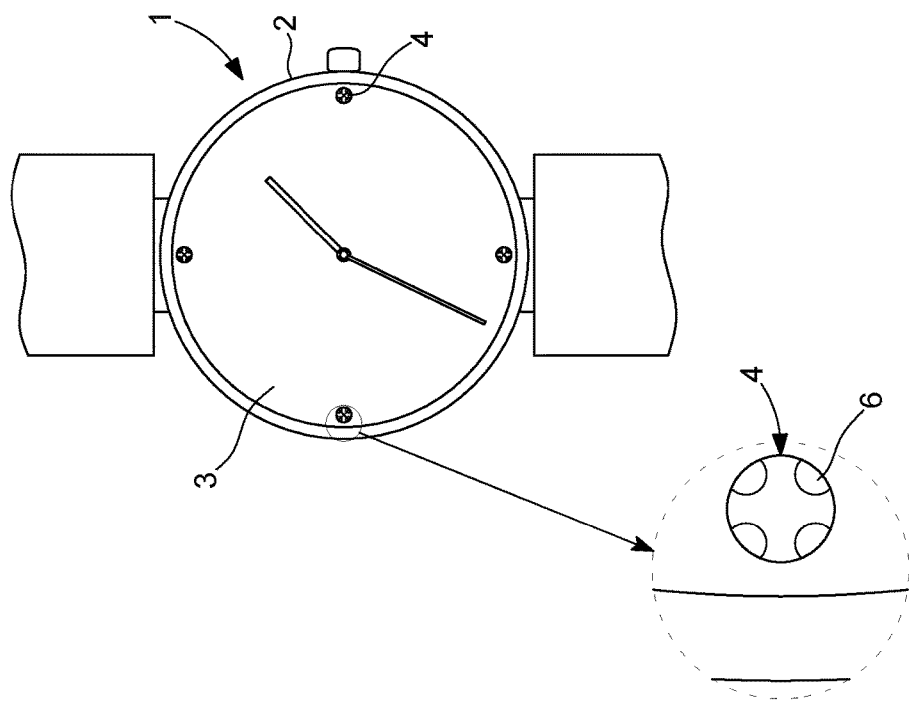

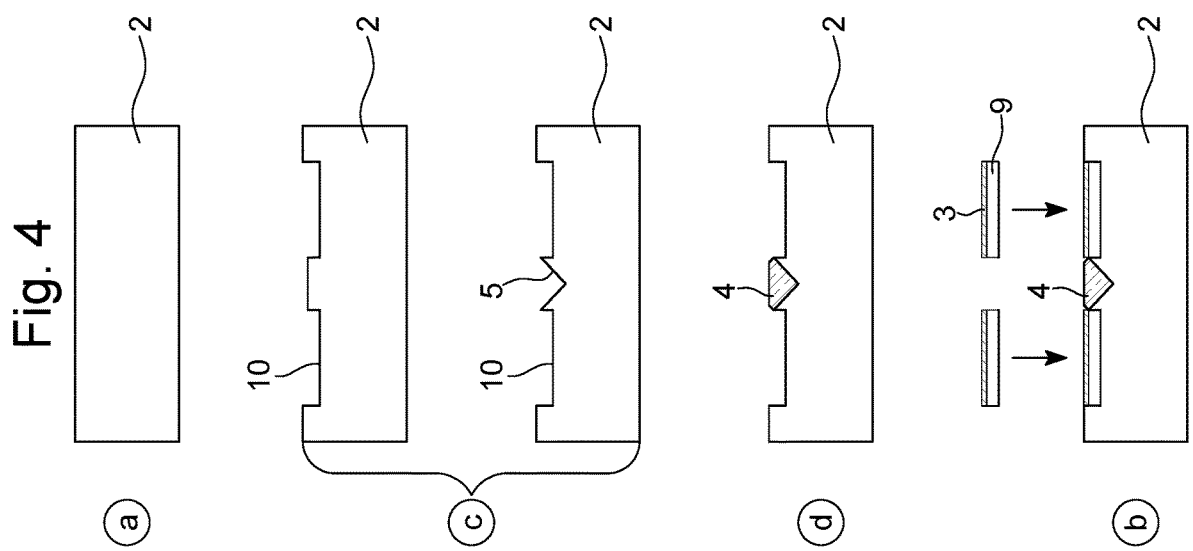
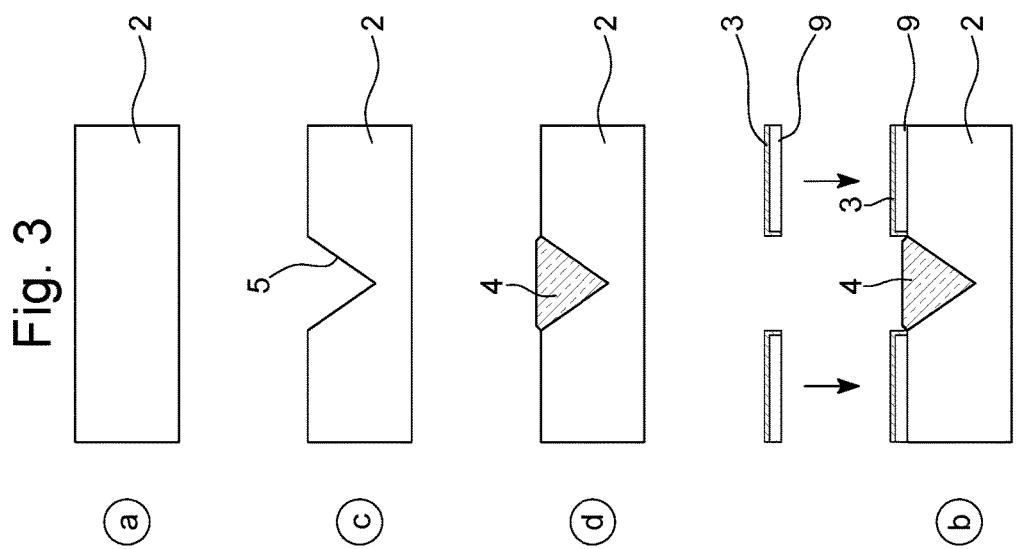

BLACK COMPONENT DECORATED WITH STONES AND MANUFACTURING METHOD THEREOF

CROSS-REFERENCE TO RELATED APPLICATION

This application claims priority to European Patent Application No. 20190569.2 filed on Aug. 11, 2020, the entire disclosure of which is hereby incorporated herein by reference.

FIELD OF THE INVENTION

The invention relates to a component intended for the internal parts or the movement of a timepiece or a piece of jewellery. It also relates to the method for manufacturing said component.

BACKGROUND OF THE INVENTION

The black "colour" can be obtained in the mass of a material through its intrinsic colour or through the addition of pigments or dyes within the material. The black "colour" can also be present only on the surface. This surface colouring can be obtained in different ways, generally by oxidation/sulfurisation/carburisation of a metal substrate or by depositing an oxide/sulphide/carbide on a substrate. Carbon is therefore an element well known to blacken a surface. Deposited in an elongated manner in the form of nanotubes, the material formed can approach a perfectly absorbent black body up to give light absorption coefficients of 99.96% in the visible and near infrared. This black is so perfect that it can hide 3D shapes of an object when viewed from the front.

The use of black coating is known in the watch industry. From document EP 3 327 517 a dial is known with a first substrate coated with a black layer of nanotubes facing the watch glass and with a second substrate fixed to the first substrate on the surface opposite to the glass. The first substrate is perforated in order to produce openings acting as windows intended to form indexes. The second substrate comprises a luminescent coating at least in the areas facing the openings so as to create a contrast at the first substrate between the black layer and the illuminated indexes.

Thus, the contrast is obtained via the superposition of two substrates having distinct coatings. This superposition avoids depositing selectively both coatings on the same surface and to manipulate more than necessary the layer of nanotubes which is particularly fragile. This superposition nevertheless has the disadvantage of requiring the manufacture of two substrates, which increases production costs.

Document CH 711 141 discloses a method for manufacturing a dial wherein the decoration, namely indexes, is affixed to the carbon black coating. The decoration is manufactured separately from the dial and then simply added, which allows to greatly facilitate the manufacture of the dial. This manufacturing technique is however unsuitable for certain types of decorations where the black colour underlying the decoration impacts the aesthetics and/or the brightness of the decoration.

In particular, this manufacturing technique is not very adapted for a decoration formed of stones, in particular diamonds. The difficulty lies in the setting of the stones on the dial coated with a black layer. The latter must be discontinuous at the stones at the risk of degrading the brightness of the stones, while perfectly coating the stones to obtain the expected contrast. Particular attention must be paid to the manufacturing method so as not to damage the layer of carbon nanotubes. The layer can be so friable that it is almost impossible to touch it without damaging the surface, showing bright hazes or even holes contrasting with the original colour of the carbon nanotubes.

Purposes of the Invention

The purpose of the present invention is to provide a method for manufacturing a watch or jewellery component coated in black and decorated with stones, and more particularly set with stones. This method is developed so as not to damage the black coating while having a discontinuous black layer at the stones.

The manufacturing method according to the invention cannot therefore be satisfied with simply adding a decoration, in this case stones, to the coating as in the prior art. According to the invention, the decoration formed from the stones is manufactured directly on the substrate with the black layer selectively deposited so as to maintain a blank surface of black below the decoration.

More specifically, the invention relates to a method for manufacturing a component intended for the internal parts or the movement of a timepiece or a piece of jewellery, said component including a substrate at least partially coated with a black layer comprising carbon nanotubes or aluminium oxide, the coated substrate being decorated with at least one stone sitting in a housing formed in the substrate, the latter being at least devoid of the black layer on the surface of the housing, said method comprising:
- a step a) of providing the substrate, followed in an unspecified order by
- a step b) of depositing the black layer on the substrate,
- a step c) of machining the housing in the substrate,
- a step d) of positioning and fixing the stone within the housing, said deposition step b) being carried out selectively so that at least the surface of the housing is devoid of the black layer.

According to a variant of the invention, the selective deposition step b) can be carried out via the deposition of a layer of precursor promoting the deposition of the black layer at selected locations or else via the fixing of plates coated with the black layer in these selected locations.

The present invention also relates to the component for the internal parts or the movement for a timepiece or a piece of jewellery comprising a substrate partially coated with a black layer and decorated with at least one stone sitting in a housing formed in the substrate, said black layer comprising carbon nanotubes or an aluminium oxide, said substrate being at least devoid of the black layer on the portion facing the stone or, in other words, on the surface of the housing.

For the variant with a diamond decoration on a coating of carbon nanotubes, the present invention proposes to produce a watch or jewellery component with two allotropic forms of carbon on the surface, one is very black for the carbon nanotubes and the other is very white for the diamond allowing very marked contrasts of brightness.

Other features and advantages of the present invention will become apparent from the description presented with reference to the appended drawings.

BRIEF DESCRIPTION OF THE DRAWINGS

FIG. 1 is a plan representation of a timepiece provided with a coated dial and decorated with stones according to the method of the invention. In enlargement, a stone with the setting element is shown.

FIGS. 2 to 4 are schematic representations of the different embodiments of the method according to the invention with the successive implemented steps.

DESCRIPTION OF THE INVENTION

The invention relates to a component intended for the internal parts or the movement of a timepiece or a piece of jewellery. It can be selected from the non-exhaustive list comprising a dial, a hand, an index, an applique, an oscillating mass, a platen, a bridge, etc. According to the invention, this component is at least partially coated with a black layer. The invention also relates to a set of two of said components at least partially coated with the black layer.

The invention will be described below in the context of an application to a watch dial 1 formed by a substrate 2 coated with a black layer 3 as shown schematically in FIG. 1. Said substrate can be made of a metal material such as steel, titanium, aluminium, a titanium or aluminium alloy, brass or any other copper alloy. It can also be made from a ceramic material, a cermet, sapphire, a composite or a polymer. The substrate 2 is decorated and preferably set with one or more stones 4 distributed within the black layer 3. It can be precious stones such as diamonds, semi-precious stones or else synthetic stones such as zirconia, etc. According to the invention, the substrate is at least devoid of the black layer on the portions facing the stones. The black layer may be present so as to be flush with the table of the stone. It can also be considered to decorate the substrate with several alignments of stones, the substrate including a black layer between the alignments.

The substrate 2 includes a housing 5 shown schematically in FIG. 2 serving as a seat for the stone 4 and more particularly for the pavilion of the stone. The fixing of the stone within the seat is preferably carried out by setting using a setting element 6 shown in the enlargement of FIG. 1. It may be the kitten claws disposed in the housing, grains which are an integral part of the substrate, undercuts in a housing for baguette or invisible setting, etc. According to the invention, the setting element is preferably also coated with the black layer so as to achieve a setting which appears invisible to the eyes of the user. Visually, it blends into the black background of the dial. Alternatively, the present invention does not exclude the stone from being glued within the seat with an adhesive which does not degrade the brightness of the stone.

According to a variant of the invention, the black layer includes carbon nanotubes. The layer of carbon nanotubes includes at least 1% by weight, preferably at least 10% by weight, of carbon nanotubes. Said layer may be a varnish comprising at least 1% by weight, preferably at least 10% by weight, of carbon nanotubes. The higher the proportion, the darker the shade. In this varnish, the carbon nanotubes are dispersed randomly. This varnish can be deposited, for example, by spraying. Alternatively, the layer includes at least 50%, at least 60%, at least 70%, at least 80%, at least 90% by weight of carbon nanotubes aligned vertically with respect to the plane of the substrate, the remainder consisting of other forms of carbon. Preferably, the layer includes 100% of carbon nanotubes aligned vertically with respect to the plane of the substrate. The vertical alignment of the nanotubes allows to obtain a deeper black compared to the random orientation of the carbon nanotubes in the varnish but has the disadvantage of having lower mechanical strength than the varnish. To overcome this disadvantage, a protective layer can be deposited on the black layer, however, with the corollary of a reduction in the light absorption coefficient. The protective layer can be a varnish or a thin layer of a material, for example $Al_2O_3$, $TiO_2$ or $SiO_2$, or a stack of layers of one or more of these materials deposited by ALD (for Atomic Layer Deposition). Nanotubes having a vertical orientation are deposited by vacuum methods such as PVD (for Physical Vapour Deposition), CVD (for Chemical Vapour Deposition) or else synthesis by laser ablation. The layer of carbon nanotubes has a thickness comprised between 1 and 100 μm.

According to another variant, the black layer is a layer comprising mainly aluminium oxides $Al_xO_y$, such as $Al_2O_3$ with in addition non-ferrous metal oxides such as, by way of example, copper zinc or manganese oxides. This layer includes at least 90% of $Al_xO_y$, preferably 100% of $Al_xO_y$. The aluminium oxide has an aluminium content comprised between 45% and 65% by mass and preferably between 45% and 50% by mass. This layer has a thickness comprised between 1 and 50 microns, preferably between 2 and 10 microns, and more preferably between 4 and 7 microns. It can be deposited by PVD, CVD or PECVD (for Plasma-Enhanced Chemical Vapour Deposition).

The component according to the invention can be manufactured according to several embodiments which are schematically illustrated in FIGS. 2 to 4. For the sake of simplification, FIGS. 2 to 4 only illustrate the substrate provided with a housing for the seat of the stone without representing the setting element. Any step involving the machining of the housing includes, where appropriate, the mechanical preparation of the setting element such as the grains.

The component manufacturing method includes, in an order which is not specified for steps b) to d):
A step a) of providing the substrate 2,
A step b) of depositing the black layer 3 on the substrate 2,
A step c) of machining the housing 5 in the substrate 2,
A step d) of positioning and fixing, and preferably setting, the stone 4 within the housing 5. The fixing covers setting in general and other fixing techniques such as gluing.

According to the invention, the deposition in step b) is carried out selectively so that at least the surface of the housing 5 is devoid of the black layer 3.

For the examples of FIGS. 2 to 4, the component manufacturing method comprises successively:
the step a) of providing the substrate 2,
the step c) of machining the housing 5 in the substrate 2,
the step d) of positioning and fixing the stone 4 within the housing 5 of the substrate 2,
the step b) of depositing the black layer 3 on the substrate 2, said deposition step b) being carried out selectively so that at least the surface of the housing 5 is devoid of the black layer 3.

For the variant of FIG. 2, there is an additional step f) of depositing and annealing a layer of a precursor 7 on the substrate 2. Step f) includes the deposition of the precursor layer and the annealing to polymerise the precursor. This variant is applicable for a black layer based on carbon nanotubes.

There is then an additional step g) of selectively removing the precursor layer 7 deposited in the housing 5. The removal can be carried out mechanically and more specifically manually using a setting tool. According to a preferred variant, this selective removal is carried out by laser ablation and more preferably with a pulsed laser such as a picosecond, nanosecond or femtosecond laser. Then follows the step d) of positioning and fixing the stone 4 within the housing 5 of the substrate 2. Finally, there is step b) of supplying the black layer 3 on the substrate 2 which is carried out selectively on the parts covered with the precursor layer 7. In an alternative manner (not shown), step f) can be carried out before step c) of machining the housing, steps c) and g) then being a same concomitant step of machining the housing and selectively removing the precursor layer at the housing. In another alternative manner (not shown), the deposition of the precursor layer can be carried out on the substrate set with the stone, the selective removal of the precursor then being carried out on the stone.

The precursor includes a polymer and carbon nanotubes. The percentage by weight of carbon nanotubes is comprised between 0.1 and 15% and the percentage by weight of polymer is comprised between 85 and 99.9%. The polymer can be selected from thermoplastics such as polyimide, polybutene, polyethylene, polyimide, polypropylene, polystyrene, polyvinyl acetate and polymethyl methacrylate or from thermosets such as polyepoxide and polyurethane. To improve the adhesion between the polymer and the carbon nanotubes, the latter can first be functionalised. For example, for a polyimide matrix, the carbon nanotubes can be functionalised beforehand by attack in an acidic medium, for example in nitric acid. The precursor comprising the mixture of carbon nanotubes distributed in the polyimide matrix is deposited and polymerised at a temperature comprised between 150 and 350° C. for a time comprised between 1 and 7 hours.

For the variant of FIGS. 3 and 4, step b) of depositing the black layer 3, which can also be qualified as the step of adding the black layer, is carried out by fixing one or more plates 9 coated with a black layer 3 on the substrate 2. Steps b), c) and d) can be carried out in different orders. Preferably, the fixing of the plates is carried out after the positioning and fixing of the stone. In FIG. 4, said plates 9 are inserted into recesses 10 made in the substrate 2 during the machining step c).

All embodiments are shown for a setting element which is covered with a black layer so as to blend with the bottom of the dial. However, the present invention does not exclude that the setting element is devoid of the black layer.

Finally, the present invention also covers an assembly comprising a first component and a second component each intended for the internal parts or the movement of a timepiece or a piece of jewellery. According to the invention, the first and second components include at least a portion coated with the black layer. Preferably, the first component has a relative movement with respect to the second component and is mounted facing the latter. This first component is decorated with one or more stones. For example, the first component is a hand coated with the black layer and decorated with a stone set or glued to the tip of the hand, and the second component is a dial coated with the black layer.

LEGEND (1) Dial
(2) Substrate
(3) Black layer
(4) Stone
(5) Housing
(6) Setting element
(7) Precursor layer
(9) Plate
(10) Recess

The invention claimed is:

1. A component for the internal parts or the movement for a timepiece or a piece of jewellery comprising a substrate partially coated with a black layer and decorated with at least one stone sitting in a housing formed in the substrate positioned on the substrate, said black layer comprising carbon nanotubes or aluminium oxide, said substrate being at least devoid of the black layer on the portion facing the stone,
   wherein the black layer is a varnish comprising by weight at least 1%, said carbon nanotubes having a random orientation within the varnish.

2. The component according to claim 1, wherein the black layer is flush with the table of the stone.

3. The component according to claim 1, wherein the stone is set within the housing with a setting element.

4. The component according to claim 3, wherein said setting element is also coated with the black layer.

5. The component according to claim 1, wherein the component includes several alignments of stones, the black layer being disposed between the alignments.

6. The component according to claim 1, wherein the black layer comprising carbon nanotubes has a thickness comprised between 1 and 100 μm.

7. A component for the internal parts or the movement for a timepiece or a piece of jewellery comprising a substrate partially coated with a black layer and decorated with at least one stone sitting in a housing formed in the substrate positioned on the substrate, said black layer comprising carbon nanotubes or aluminium oxide, said substrate being at least devoid of the black layer on the portion facing the stone, wherein the black layer comprises at least 90% by weight of aluminium oxide.

8. The component according to claim 7, wherein the aluminium oxide has an aluminium content by weight comprised between 45% and 65%.

9. The component according to claim 7, wherein the black layer has a thickness comprised between 1 and 50 microns.

10. The component according to claim 1, wherein the component is selected from the group comprising a dial, an index, a hand, an applique, an oscillating mass, a platen and a bridge.

11. An assembly comprising a component for the internal parts or the movement for a timepiece or a piece of jewellery comprising a substrate partially coated with a black layer and decorated with at least one stone sitting in a housing formed in the substrate positioned on the substrate, said black layer comprising carbon nanotubes or aluminium oxide, said substrate being at least devoid of the black layer on the portion facing the stone and another component for the internal parts or the movement for a timepiece or a piece of jewellery. said other component being at least partially coated with said black layer, wherein the component is disposed facing said other component and mounted with a relative movement with respect to said other component.

12. An assembly comprising a component for the internal parts or the movement for a timepiece or a piece of jewellery comprising a substrate partially coated with a black layer and decorated with at least one stone sitting in a housing formed in the substrate positioned on the substrate, said black layer comprising carbon nanotubes or aluminium oxide, said substrate being at least devoid of the black layer on the portion facing the stone and another component for the internal parts or the movement for a timepiece or a piece of jewellery, said other component being at least partially coated with said black layer, wherein the component is a hand and wherein the other component is a dial.

\* \* \* \* \*